United States Patent
Kim

(10) Patent No.: US 9,093,331 B2
(45) Date of Patent: Jul. 28, 2015

(54) LIQUID CRYSTAL DISPLAY DEVICE HAVING TOUCH SENSOR EMBEDDED THEREIN, METHOD FOR DRIVING THE SAME, AND METHOD FOR FABRICATING THE SAME

(71) Applicant: LG DISPLAY CO., LTD., Seoul (KR)

(72) Inventor: Cheol-Se Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/278,483

(22) Filed: May 15, 2014

(65) Prior Publication Data
US 2014/0256074 A1    Sep. 11, 2014

Related U.S. Application Data

(62) Division of application No. 14/022,955, filed on Sep. 10, 2013, now Pat. No. 8,749,521, which is a division of application No. 12/980,872, filed on Dec. 29, 2010, now Pat. No. 8,553,013.

(30) Foreign Application Priority Data

Aug. 10, 2010  (KR) .................. 10-2010-0077003

(51) Int. Cl.
*H01L 21/00* (2006.01)
*H01L 27/12* (2006.01)
*G06F 3/041* (2006.01)
*G06F 3/044* (2006.01)
*G02F 1/1333* (2006.01)

(52) U.S. Cl.
CPC ........ *H01L 27/1259* (2013.01); *G02F 1/13338* (2013.01); *G06F 3/044* (2013.01); *G06F 3/0412* (2013.01)

(58) Field of Classification Search
CPC ..................... H01L 21/28291; H01L 21/1259; G06F 3/0416; G06F 3/044; G06F 3/0412; G02F 1/13338; G09G 3/3648; G09G 2300/0443; G09G 2300/0426; Y10T 29/49117
See application file for complete search history.

(56) References Cited

U.S. PATENT DOCUMENTS

| 5,392,058 A | 2/1995 | Tagawa |
|---|---|---|
| 2004/0227743 A1 | 11/2004 | Brown |
| 2008/0198143 A1 | 8/2008 | Kinoshita et al. |
| 2008/0252618 A1 | 10/2008 | Chung et al. |
| 2008/0297709 A1 | 12/2008 | Eguchi |
| 2008/0309627 A1 | 12/2008 | Hotelling et al. |
| 2009/0135158 A1 | 5/2009 | Takahashi et al. |

(Continued)

*Primary Examiner* — Shaun Campbell
(74) *Attorney, Agent, or Firm* — Brinks Gilson & Lione

(57) ABSTRACT

Disclosed is a liquid crystal display device having touch sensors embedded therein. The liquid crystal display device includes a liquid crystal layer interposed between upper and lower substrates, pixels, each of which includes pixel and common electrodes applying a horizontal electric field to the liquid crystal layer, a pixel thin film transistor to drive the pixel electrode, and a common thin film transistor to drive the common electrode, touch sensors, each of which forms a sensing capacitor between an object and the common electrode, sensor power lines, readout lines, and sensor gate lines. Each touch sensor includes the common electrode, a first sensor thin film transistor charging the common electrode with the sensing driving voltage in response to control of the previous sensor gate line, and a second sensor thin film transistor outputting the sensing signal to the readout line in response to control of the current sensor gate line.

6 Claims, 13 Drawing Sheets

(56) References Cited

U.S. PATENT DOCUMENTS

| | | |
|---|---|---|
| 2009/0231505 A1 | 9/2009 | Wang et al. |
| 2009/0284492 A1 | 11/2009 | Chino |
| 2010/0097340 A1 | 4/2010 | Mizuhashi et al. |
| 2010/0328255 A1 | 12/2010 | Ishizaki et al. |
| 2011/0057908 A1 | 3/2011 | Park et al. |
| 2011/0061948 A1 | 3/2011 | Krah et al. |
| 2011/0221697 A1 | 9/2011 | Okamoto et al. |
| 2012/0139864 A1 | 6/2012 | Sleeman et al. |

LIQUID CRYSTAL DISPLAY DEVICE HAVING TOUCH SENSOR EMBEDDED THEREIN, METHOD FOR DRIVING THE SAME, AND METHOD FOR FABRICATING THE SAME

The present patent document is a divisional of U.S. patent application Ser. No. 14/022,955, filed on Sep. 10, 2013 which is a divisional of U.S. patent application Ser. No. 12/980,872, filed Dec. 29, 2010, which claims priority to Korean Patent Application No. 10-2010-0077003 filed in Korea on Aug. 10, 2010.

BACKGROUND

1. Field of the Invention

The present disclosure relates to a liquid crystal display device, and more particularly, a liquid crystal display device having touch sensors embedded therein which achieves weight and thickness reduction, a method for driving the same, and a method for fabricating the same.

2. Discussion of the Related Art

Touch screens enabling input of data by touching a screen of various display devices are widely applied as data input devices for computer systems. The touch screens allow a user to simply touch a screen by hand or using a stylus so as to move or select displayed data, and thus are easily used by men and women of all ages.

A touch screen senses touch and a touched position generated on a screen of a display device and outputs touch data, and a computer system analyzes the touch data and performs instructions. As the display device, a flat panel display device, such as a liquid crystal display (LCD) device, a plasma display panel (PDP) device, or an organic light emitting diode (OLED) device, is mainly used.

As to types of touch screens, there are a resistive type, a capacitive type, an infrared type, an ultrasonic type, and an electromagnetic type according to sensing principles. Among these types, the resistive type and the capacitive type are advantageous in terms of manufacturing costs, thus being widely used.

A resistive type touch screen recognizes touch by sensing a change in voltage generated by contact between upper and lower resistive films (transparent conductive films) by touch pressure. However, the resistive type touch screen has the disadvantage that the touch screen or a display device can be easily damaged due to the touch pressure. Also, light transmittance is lowered due to light scattering effect of an air layer between the resistive films.

A capacitive type touch screen, which compensates for the disadvantages of the resistive type touch screen, recognizes touch by sensing a change in capacitance generated by movement of a small amount of electric charge to a touch point when the touch is carried out by a conductor, such as a human body or a stylus. The capacitive type touch screen, which uses tempered glass, has high durability, high light transmittance, and excellent touch sensing ability, thereby enabling multi-touch sensing and thus attracting attention.

In general, a touch screen is manufactured in the shape of a panel, and is attached to the upper surface of a display device, thus enabling a touch input function. However, a display device having a touch panel attached thereto, in which the touch panel is manufactured separately from the display device and then is attached to the display device, raises manufacturing costs and increases the overall thickness and weight of a system, thus causing deterioration of mobility or design limitations.

BRIEF SUMMARY

A liquid crystal display device having touch sensors embedded therein includes a liquid crystal layer interposed between upper and lower substrates, a plurality of pixels, respectively formed in pixel regions of the lower substrate, each of the plurality of pixels including a pixel electrode and a common electrode applying a horizontal electric field to the liquid crystal layer, a pixel thin film transistor connected with a gate line and a data line to drive the pixel electrode, and a common thin film transistor connected with the gate line and a common line to drive the common electrode, the touch sensors, each of which forms a sensing capacitor between an object touching the upper substrate and the common electrode to sense touch and then to output a sensing signal, sensor power lines to supply sensing driving voltage to the respective touch sensors, readout lines to output the sensing signal from the respective touch sensors, and sensor gate lines formed in parallel with gate lines, wherein each of the touch sensors includes the common electrode formed in plural pixels, a first sensor thin film transistor to charge the common electrode with the sensing driving voltage from the corresponding sensor power line in response to control of the previous sensor gate line, and a second sensor thin film transistor to output the sensing signal from the common electrode to the corresponding readout line in response to control of the current sensor gate line.

In another aspect of the present invention, a method for driving a liquid crystal display device having touch sensors embedded therein includes storing data in a plurality of pixels by driving gate lines and data lines, and applying horizontal electric fields based on the data to a liquid crystal layer using a pixel electrode and a common electrode of each pixel, during a data recording period, and sensing touch through a touch sensor using a sensing capacitor formed between an object touching an upper substrate of the liquid crystal display device and the common electrode by driving the common electrode formed in the unit of plural pixels, during a touch sensing period, wherein the touch sensing through the touch sensor includes supplying sensing driving voltage from a sensor power line to the common electrode of the touch sensor by driving a first sensor thin film transistor of the touch sensor, and outputting a sensing signal generated from the common electrode by the touch sensing to a readout line by driving a second sensor thin film transistor of the touch sensor.

In a further aspect of the present invention, a method for fabricating a liquid crystal display device having touch sensors embedded therein includes forming a gate metal pattern, including gate electrodes of pixel thin film transistors, common thin film transistors, and sensor thin film transistors together with gate lines, common lines, and sensor gate lines, on a substrate, forming a gate dielectric layer on the substrate provided with the gate metal pattern formed thereon, forming semiconductor layers of the pixel thin film transistors, the common thin film transistors, and the sensor thin film transistors on the gate dielectric layer, forming a data metal pattern, including source electrodes and drain electrodes of the pixel thin film transistors, the common thin film transistors, and the sensor thin film transistors together with data lines and readout lines, on the gate dielectric layer provided with the semiconductor layers formed thereon, forming pixel electrodes connected with the drain electrodes of the pixel thin film transistors on the gate dielectric layer provided with the data metal pattern formed thereon, forming a passivation layer covering the pixel electrodes, and forming a plurality of contact holes, and forming common electrodes connected with the drain electrodes of the common thin film transistors and the sensor thin film transistors, first contact electrodes to connect the source electrodes of the common thin film transistors and the common lines, and second contact electrodes to connect the gate electrodes of the sensor thin film transistors and the sensor gate lines, on the passivation layer, the connection of the common electrodes, the first contact electrodes, and the second contact electrodes being achieved through the plurality of contact holes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Hereinafter, with reference to the accompanying drawings, a liquid crystal display device having touch sensors embedded therein, a method for driving the same, and a method for fabricating the same will be described in detail.

Figure 1:
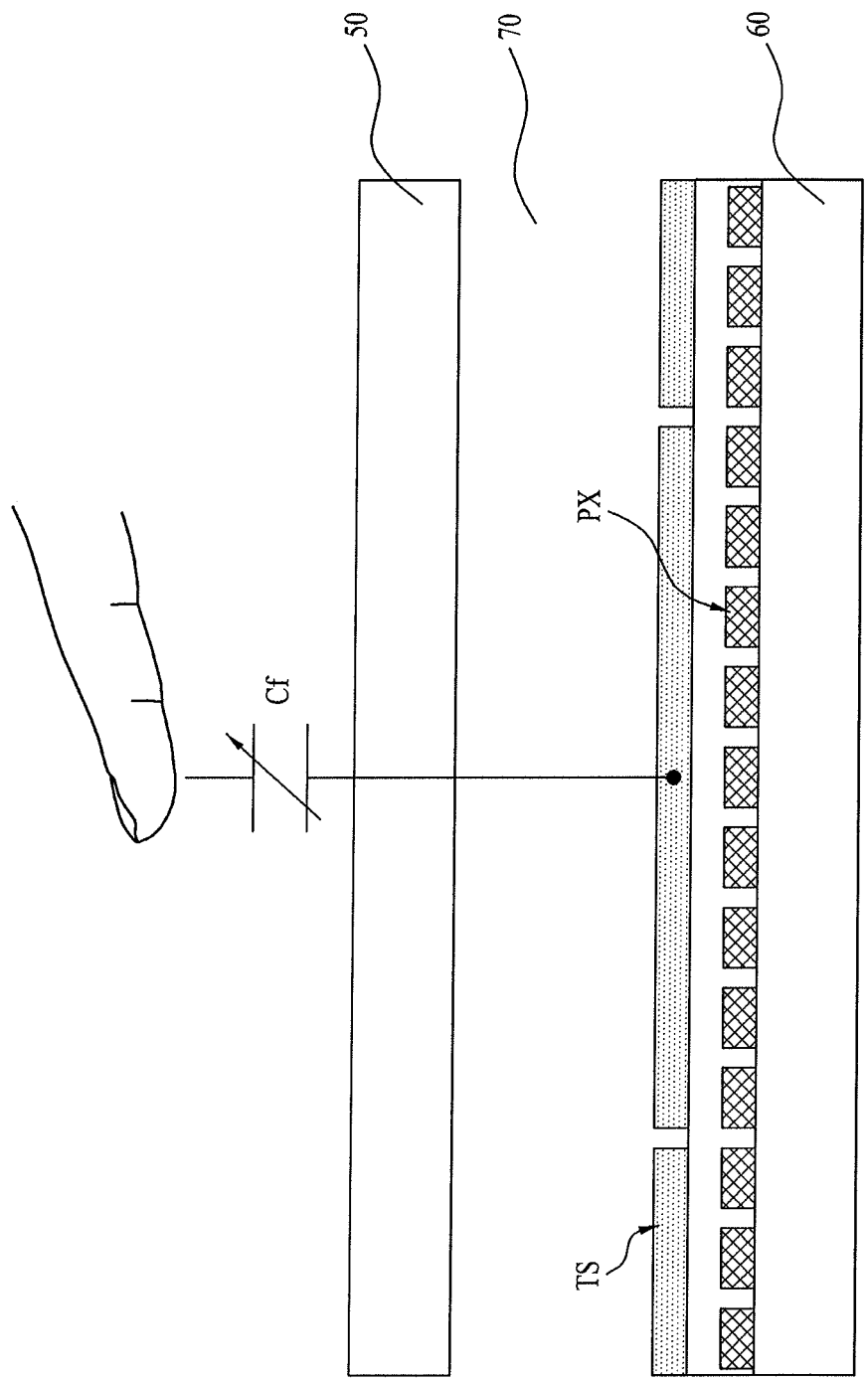
FIG. 1 is a view schematically illustrating a vertical-sectional structure of a liquid crystal display device having touch sensors embedded therein in accordance with one embodiment of the present invention.

FIG. 1 is a view schematically illustrating a vertical-sectional structure of a liquid crystal display device having touch sensors embedded therein in accordance with one embodiment of the present invention.

The liquid crystal display device of FIG. 1 includes an upper substrate 50, a lower substrate 60, and a liquid crystal layer 70 formed between the upper and lower substrates 50 and 60.

A thin film transistor array including a plurality of pixels PX and a plurality of touch sensors TS is formed on the lower substrate 60. Each of the touch sensors TS is formed in the unit of plural pixels PX. Each of the pixels PX applies a horizontal electric field to the liquid crystal layer 70, thereby driving the liquid crystal layer 70 in an in plane switching (IPS) mode or a fringe field switching (FFS) mode. For this purpose, each pixel PX includes a pixel electrode to receive a data signal through a thin film transistor connected with a gate line and a data line, and a common electrode to receive common voltage and to apply the horizontal electric field to the liquid crystal layer 70 together with the pixel electrode. Particularly, the common electrode is patterned in the unit of plural pixels, and is used as a common electrode during data recording and used as a sensing electrode to sense touch in a capacitive type during touch sensing. Since each pixel PX of the lower substrate 60 applies the horizontal electric field to the liquid crystal layer 70 and thus the upper substrate 50 requires no electrode to drive the liquid crystal layer 70, it is possible to perform touch sensing in the capacitive type using the common electrodes form on the lower substrate 60. A color filter array including a black matrix defining the pixels PX and red, green, blue color filters corresponding to the respective pixels PX is formed on the upper substrate 50. The liquid crystal display device further includes upper and lower polarizing plates, optical axes of which are orthogonal to each other and which are attached to the outer surfaces of the upper and lower substrates 50 and 60, and upper and lower alignment films formed on the inner surfaces of the upper and lower substrates 50 and 60 contacting liquid crystals to set a pretilt angle of the liquid crystals.

When a user touches the surface of the upper substrate 50 with a conductive object, such as a human body or a stylus, the object and the touch sensor TS of the lower substrate 60 form a sensing capacitor Cf under the condition that the upper substrate 50 and the liquid crystal layer 70 are interposed between the object and the touch sensor TS. The touch sensor TS senses a change in capacitance due to the formation of the sensing capacitor Cf, and outputs a sensing signal expressing touch.

Figure 2:
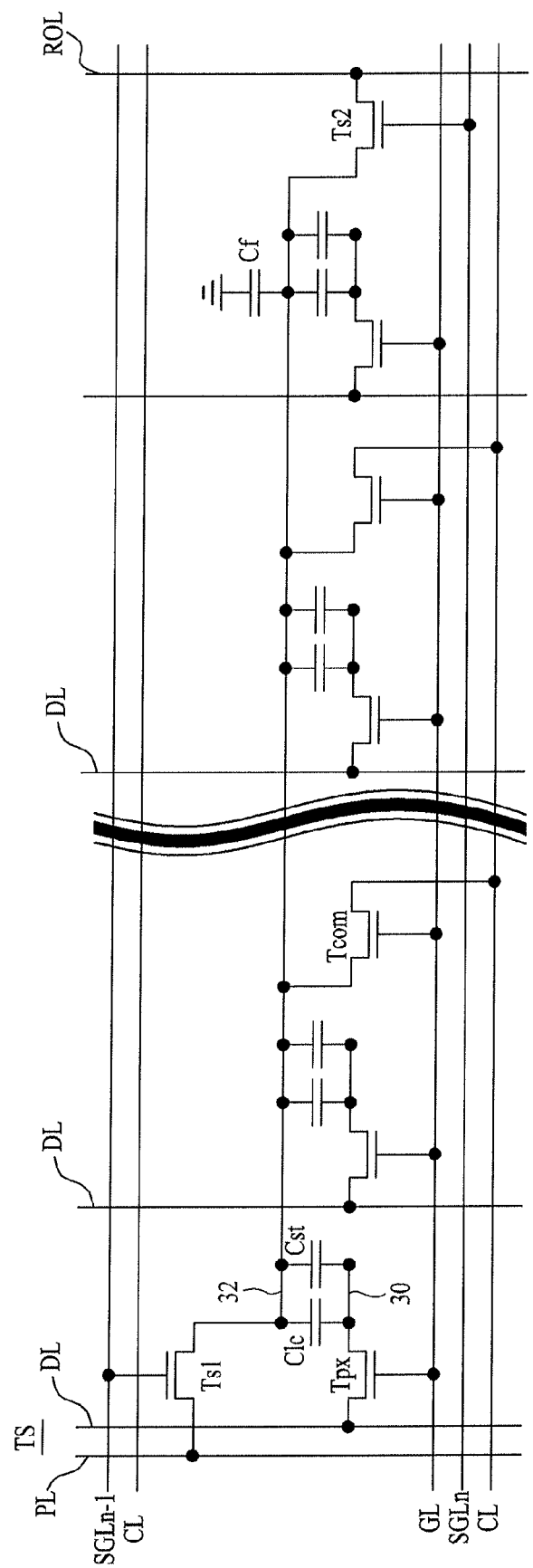
FIG. 2 is an equivalent circuit diagram of some pixels provided with one touch sensor in the liquid crystal display device in accordance with the embodiment of the present invention.

FIG. 2 is an equivalent circuit diagram of some pixels provided with one touch sensor in the liquid crystal display device in accordance with the embodiment of the present invention.

The liquid crystal display device of FIG. 2 includes a plurality of pixels, and touch sensor TS, each of which is formed in the unit of plural pixels. A plurality of gate lines GL and a plurality of data lines DL are formed so as to cross each other, a common line CL and a sensor gate line SGL are formed in parallel with each gate line GL, and a sensor power line PL and a readout line ROL are formed in parallel with the data lines DL under the condition that the plural data lines DL are interposed between the sensor power line PL and the readout line ROL.

Each pixel includes a pixel thin film transistor Tpx, a common thin film transistor Tcom, and a liquid crystal capacitor Clc and a storage capacitor Cst connected in parallel between the pixel thin film transistor Tpx and a common electrode 32. The liquid crystal capacitor Clc includes a pixel electrode 30 connected with the pixel thin film transistor Tpx, the common electrode 32 connected with the common thin film transistor Tcom, and a liquid crystal layer between the pixel electrode 30 and the common electrode 32. The storage capacitor Cst is formed by overlapping the pixel electrode 30 and the common electrode 32 under the condition that a dielectric layer is interposed between the pixel electrode 30 and the common electrode 32. The pixel electrode 30 is formed in the unit of each pixel, but the common electrode 32 is formed in the unit of plural pixels. The common electrode 32 is used as a common electrode of the liquid crystals during data recording and is used as a sensing electrode of the touch sensor TS during touch sensing. The pixel thin film transistor Tpx supplies a data signal from the data line DL to the pixel electrode 30 in response to a gate signal of the gate line GL. Simultaneously, the common thin film transistor Tcom supplies common voltage from the common line CL to the common electrode 32 in response to the gate signal of the same gate line GL as the pixel thin film transistor Tpx. Thereby, during data recording, the liquid crystal capacitor Clc and the storage capacitor Cst are charged with voltage corresponding to a difference between the common voltage and the data signal, and thus the liquid crystal capacitor Clc drives the liquid crystals according to the charged voltage and the storage capacitor Cst stably maintains the charged voltage of the liquid crystal capacitor Clc.

The touch sensor Ts includes the sensor gate lines SGL formed in parallel with the gate lines GL and the common line CL, the sensor power line PL and the readout line ROL formed in parallel with the data lines DL under the condition that the plural data lines DL are interposed between the sensor power line PL and the readout line ROL, the common electrode 32 formed in common in the plural pixels, a first sensor thin film transistor TsI connected between an n-I$^{th}$ (n: natural number) sensor gate line SGLn−1, the sensor power line PL, and the common electrode 32, and a second sensor thin film transistor Ts2 connected between an n$^{th}$ sensor gate line SGLn, the readout line ROL, and the common electrode 32. The touch sensor TS is formed in the unit of plural pixels in consideration of a touch point size of about 3~5 mm. For example, if a line width of a touch point is about 4 mm, the touch sensor TS is formed in the unit of about 50 pixels. In order to ensure that each of the pixels has the same size, the common thin film transistor Tcom may be omitted in the pixels, in which the first and second sensor thin film transistor Ts1 and Ts2 are formed. In this case, two thin film transistors are formed in each of the respective pixels.

A gate electrode of the first sensor thin film transistor TsI is connected with the n-I$^{th}$ sensor gate line SGLn−1, a source electrode of the first sensor thin film transistor Ts1 is connected with the sensor power line PL, and a drain electrode of the first sensor thin film transistor Ts1 is connected with one terminal of the common electrode 32. The source electrode and the drain electrode may be interchanged according to a current direction. The first sensor thin film transistor Ts1 charges the sensing electrode 32 with sensing driving voltage Vd from the sensor power line PL in response to a gate signal supplied to the n-I$^{th}$ sensor gate line SGLn−1.

A gate electrode of the second sensor thin film transistor Ts2 is connected with the n$^{th}$ sensor gate line SGLn, a source electrode of the second sensor thin film transistor Ts2 is connected with the readout line ROL, and a drain electrode of the second sensor thin film transistor Ts2 is connected with the other terminal of the common electrode 32. The source electrode and the drain electrode may be interchanged according to the current direction. The second sensor thin film transistor Ts2 outputs a sensing signal increasing proportional to the size of the sensing capacitor Cf to the readout line ROL, when the sensing capacitor Cf is formed.

The touch sensor TS formed in the unit of the plural pixels is driven by a pair of the sensor gate lines SGLn−1 and SGLn, senses touch in a capacitive type, and outputs a sensing signal to the readout line ROL. During touch sensing, when the first sensor thin film transistor TsI is turned on in response to the gate signal of the n-I$^{th}$ sensor gate line SGLn−1, the common electrode 32 of the touch sensor TS is charged with the sensing driving voltage Vd from the sensor power line PL. Thereafter, when the second sensor thin film transistor Ts2 is turned on in response to the gate signal of the n$^{th}$ sensor gate line SGLn, the voltage from the common electrode 32 is output as a sensing signal to the readout line ROL. Here, when a user touches the surface of the liquid crystal display device with a conductive object, such as a human body or a stylus, the sensing capacitor Cf between the object and the common electrode 32 is generated. When the sensing capacitor Cf is generated, capacitance connected to the common electrode 32 increases and the quantity of electric charge increases, and thus the sensing signal output from the common electrode 32 to the readout line ROL through the second sensor thin film transistor Ts2 increases, thereby representing the touch.

In detail, since the liquid crystal capacitors Clc and the storage capacitors Cst of the plural pixels are connected in parallel to the common electrode 32 formed in the unit of the plural pixels, the capacitance connected to the common electrode 32 is the sum total (Ctotal=m×(Clc+Cst)) of capacitances of liquid crystal capacitors Clc provided in plural number (i.e., m liquid crystal capacitors Cls, m being a positive number larger than 2) and capacitances of storage capacitors Cst provided in the plural number. During touch, when the sensing capacitor Cf is formed, the capacitance connected to the common electrode 32 is raised to the sum total of the total capacitance Ctotal and capacitance of the sensing capacitor Cf (Cf+Ctotal). Therefore, the quantity of electric charge supplied to the common electrode 32 increases due to increase of the capacitance connected to the common electrode 32 during touch, and thus the sensing signal output from the common electrode 32 to the readout line ROL through the second sensor thin film transistor Ts2 increases, thereby representing the touch. Further, the sensing signal output from the common electrode 32 to the readout line ROL through the second sensor thin film transistor Ts2 increases proportional to a difference (Vd−Vref) between the sensing driving voltage Vd supplied to the common electrode 32 and reference voltage Vref supplied to the readout line ROL.

Since, as described above, the sensing signal output from the common electrode 32 of the touch sensor TS to the readout line ROL through the second sensor thin film transistor Ts2 is determined simply by the difference (Vd−Vref) between the sensing driving voltage Vd supplied to the common electrode 32 and the reference voltage Vref supplied to the readout line ROL, although threshold voltage Vth of the second sensor thin film transistor Ts2 is varied, the precise sensing signal is output regardless of the threshold voltage Vth.

Figure 3:
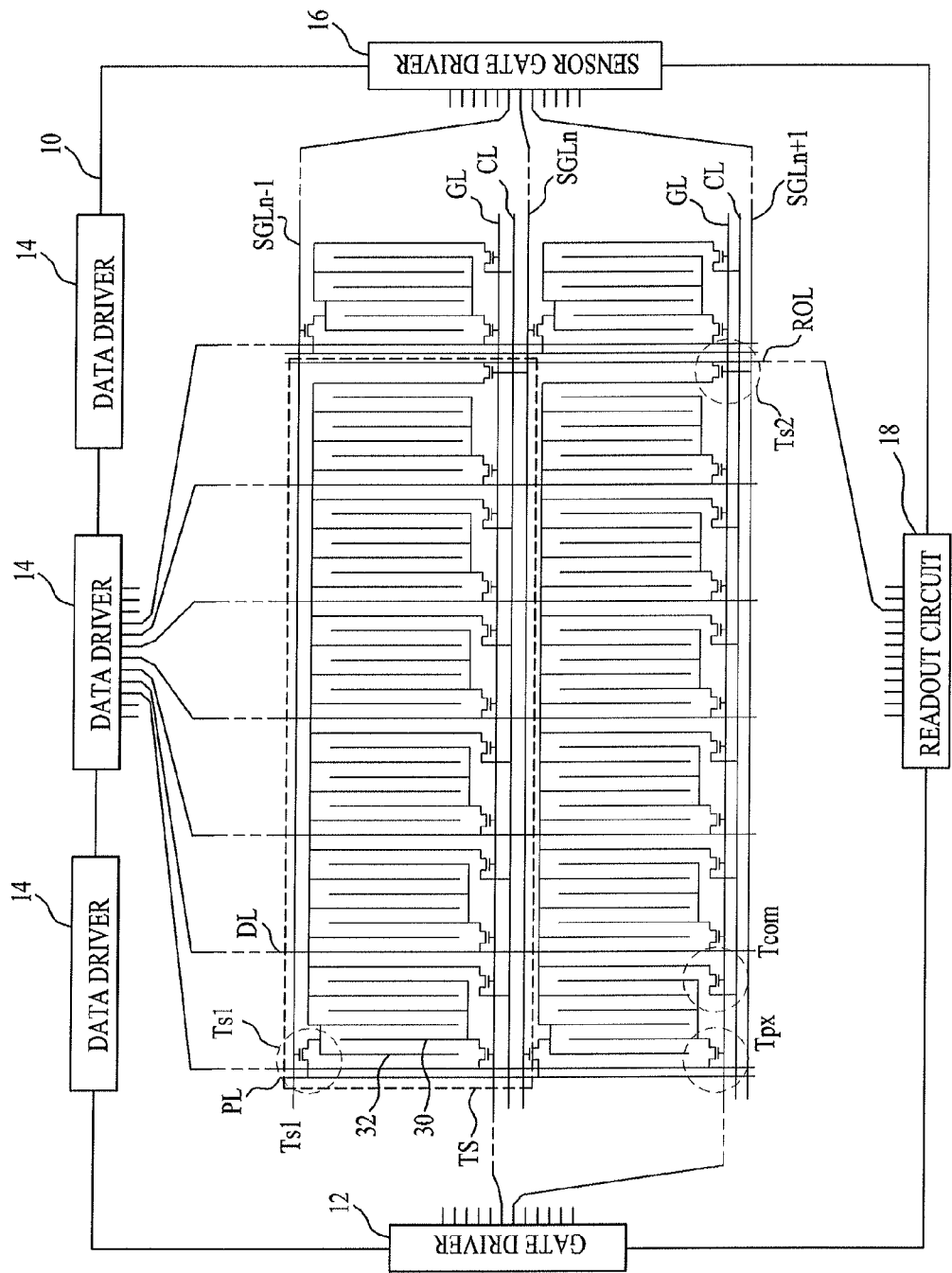
FIG. 3 is a block diagram schematically illustrating an IPS-mode liquid crystal display device having touch sensors embedded therein in accordance with one embodiment of the present invention.

FIG. 3 is a block diagram schematically illustrating an IPS-mode liquid crystal display device having touch sensors embedded therein in accordance with one embodiment of the present invention.

The liquid crystal display device of FIG. 3 includes a liquid crystal panel 10 having plural touch sensors TS together with plural pixels, a gate driver 12 to drive plural gate lines GL of the liquid crystal panel 10, data drivers 14 to drive plural data lines DL of the liquid crystal panel 10, a sensor gate driver 16 to drive sensor gate lines SGL of the liquid crystal panel 10, and a readout circuit 18 to supply reference voltage Vref to a readout line ROL of the liquid crystal panel 10 and to monitor output of the readout line ROL so as to sense touch.

In FIG. 3, the readout circuit 18 may be located opposite to the data drivers 14 under the condition that a display region is interposed between the readout circuit 18 and the data drivers 14, or may be embedded in the data drivers 14. The sensor gate driver 16 may be located opposite to the gate driver 12 under the condition that the display region is interposed between the sensor gate driver 16 and the gate driver 12, or may be embedded in the gate driver 12.

Figure 4:
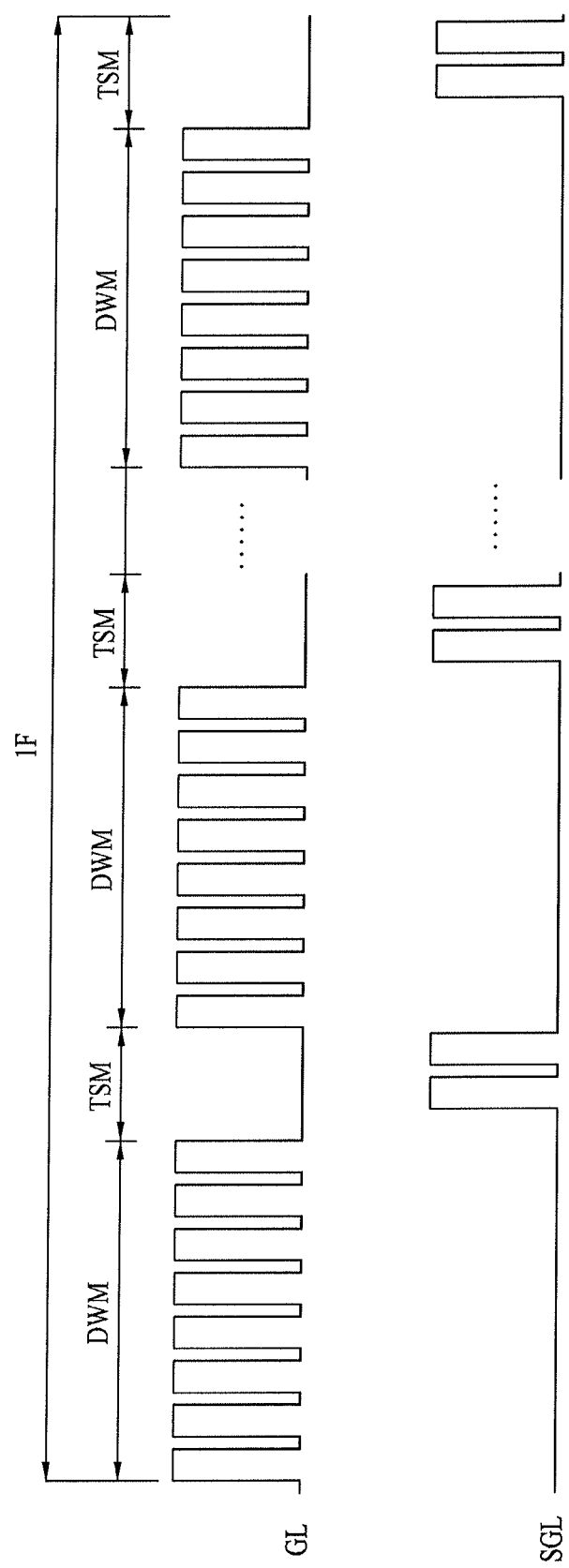
FIG. 4 is a view illustrating a driving wave form of the liquid crystal display device of FIG. 3.

The liquid crystal panel 10 includes the plural pixels defined by crossing the plural gate lines GL and the plural data lines DL, and the plural touch sensors, each of which is formed in the unit of plural pixels. The driving of the liquid crystal panel 10 is divided into a data recording period DWM and a touch sensing period TSM, as shown in FIG. 4.

Each pixel includes a pixel electrode 30 and the common electrode 32 forming a horizontal electric field, a pixel thin film transistor Tpx connected between the gate line GL, the data line DL, and the pixel electrode 30, and a common thin film transistor Tcom connected between the gate line GL, the common line CL, and the common electrode 32. The pixel electrode 30 is formed in the unit of each pixel, but the common electrode 32 is formed in the unit of plural pixels and thus is used as a common electrode of liquid crystals during the data recording period DWM and is used as a sensing electrode of the touch sensor TS during the touch sensing period TSM. The pixel thin film transistor Tpx supplies a data signal from the data line DL to the pixel electrode 30 in response to a gate signal of the gate line GL, and the common thin film transistor Tcom supplies common voltage from the common line CL to the common electrode 32 in response to the gate signal of the same gate line GL as that of the pixel thin film transistor Tpx. Thereby, during the data recording period DWM, each pixel drives the liquid crystals with a horizontal electric field due to the difference between the common voltage supplied to the common electrode 32 and the data signal supplied to the pixel electrode 30, thereby realizing a gray level.

The touch sensor Ts includes the sensor gate lines SGL formed in parallel with the gate lines GL and the common line CL, the sensor power line PL and the readout line ROL formed in parallel with the data lines DL under the condition that the plural data lines DL are interposed between the sensor power line PL and the readout line ROL, the common electrode 32 formed in common in the plural pixels, a first sensor thin film transistor TsI connected between an n-1$^{th}$ (n: natural number) sensor gate line SGLn−1, the sensor power line PL, and the common electrode 32, and a second sensor thin film transistor Ts2 connected between an n$^{th}$ sensor gate line SGLn, the readout line ROL, and the common electrode 32. During the touch sensing period TSM, the touch sensor TS formed in the unit of the plural pixels is driven by a pair of the sensor gate lines SGLn−1 and SGLn, senses touch in the capacitive type, and outputs a sensing signal to the readout line ROL. During touch sensing, when the first sensor thin film transistor TsI is turned on in response to the gate signal of the n-1$^{th}$ sensor gate line SGLn−1, the common electrode 32 of the touch sensor TS is charged with the sensing driving voltage Vd from the sensor power line PL. Thereafter, when the second sensor thin film transistor Ts2 is turned on in response to the gate signal of the n$^{th}$ sensor gate line SGLn, the voltage from the common electrode 32 is output as a sensing signal to the readout line ROL. Here, when a user touches the surface of the liquid crystal display device with a conductive object, such as a human body or a stylus, and thus the sensing capacitor Cf is generated, capacitance increases and thus the sensing signal output from the common electrode 32 to the readout line ROL increases, thereby representing the touch.

The sensor power line PL and the readout line ROL are connected to plural touch sensors arranged in the vertical direction. The sensor gate line SGL is connected to plural touch sensors arranged in the horizontal direction. The respective sensor gate lines SGL are independently driven, and plural sensor gate lines SGL are connected in common and are driven in the unit of the plural sensor gate lines SGL. The touch sensors TS are arranged in a matrix, thus enabling multi-touch sensing, simultaneously.

The driving of the liquid crystal panel 10 is divided into the data recording period DWM in which data are stored in the pixels and the touch sensing period TSM in which the touch sensors TS are driven, as shown in FIG. 4. One frame 1F is divided into plural horizontal periods (horizontal lines) such that the data recording period DWM and the touch sensing period TSM are alternately repeated. For example, data are recorded in 8 horizontal lines by sequentially driving 8 gate lines GL during the data recording period DWM, and then whether or not touch is present is detected by the touch sensors TS by sequentially driving 2 sensor gate lines SGL during the touch sensing period TSM, as shown in FIG. 3. These data recording period DWM and touch sensing period TSM are alternately repeated.

During the data recording period DWM, the gate driver 12 sequentially drives the plural gate lines GL, and the data drivers 14 supply a data signal to the plural data lines DL whenever the gate lines GL are driven. Here, the gate driver 12 and the data drivers 14 drive the gate lines GL and the data lines DL in a more rapid cycle than a general cycle to record the data in the respective pixels, thereby obtaining the touch sensing period TSM in which the touch sensor TS is driven without increase in the period of one frame 1F.

During the touch sensing period TSM, the sensor gate driver 16 sequentially drives the sensor gate lines SGL, and the readout circuit 18 receives the sensing signal input from the touch sensor TS through the read out line ROL, thereby sensing touch and a touch position. The readout circuit 18 senses the touch by integrating output current of the readout line ROL per unit time. Further, the readout circuit 18 senses the touch position (X and Y coordinates) based on position data (X coordinates) of the readout line ROL and position data (Y coordinates) of the sensor gate lines SGL. The readout circuit 18 senses multi-touch simultaneously generated at different points through the touch sensor TS and the readout line ROL.

Figure 5:
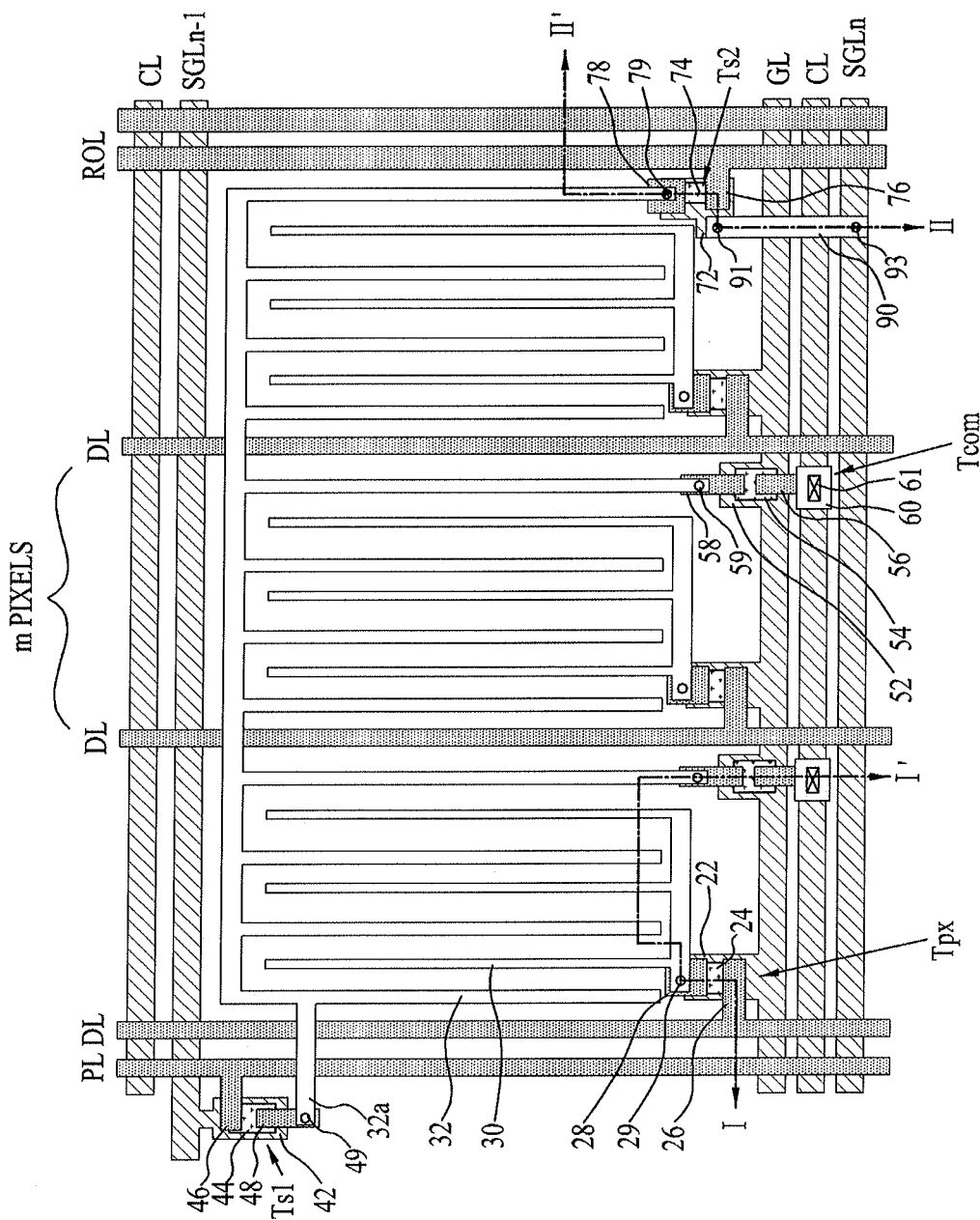
FIG. 5 is a plan view of a thin film transistor substrate for some pixels provided with one touch sensor in the IPS-mode liquid crystal display device in accordance with the embodiment of the present invention.
Figure 6A:
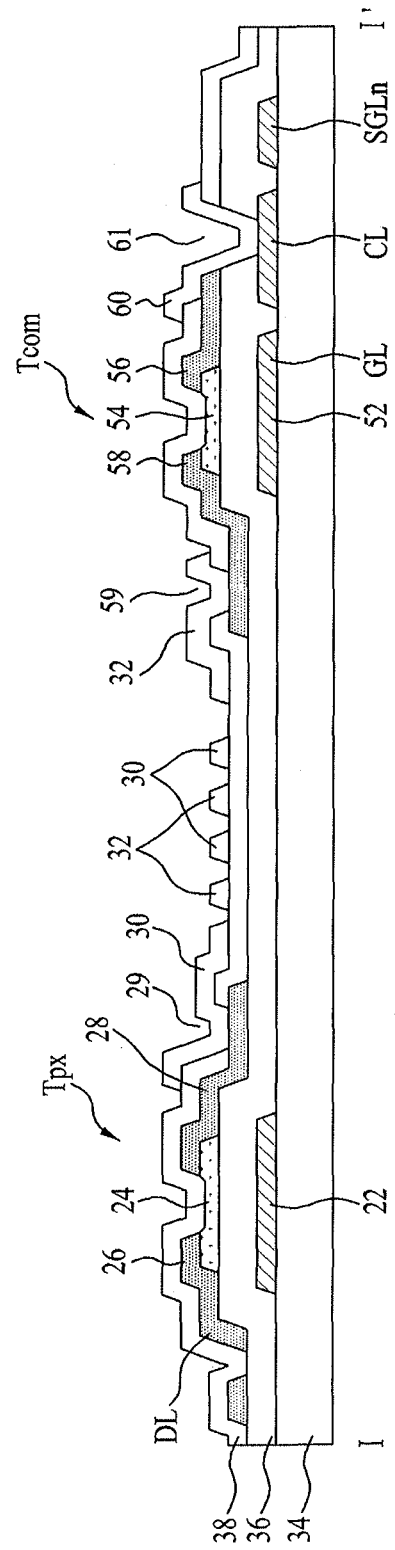
FIGS. 6A and 6B are sectional views of the thin film transistor substrate, taken along the line I-I' and the line II-II' of FIG. 5, respectively.
Figure 6B:
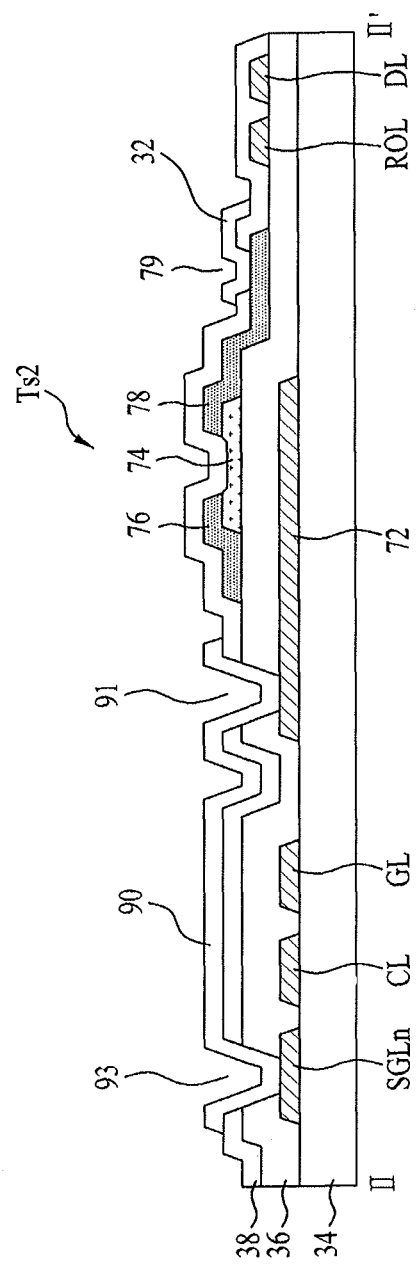

FIG. 5 is a plan view of a thin film transistor substrate for plural pixels provided with one touch sensor in the IPS-mode liquid crystal display device of FIG. 3, and FIGS. 6A and 6B are sectional views of the thin film transistor substrate, taken along the line I-I' and the line II-II' of FIG. 5, respectively.

Although FIG. 5 illustrates only 3 pixels, the central pixel may be repeated about m times such that the length of the pixels is 3~5 mm. The sectional view of 6A, taken along the line I-I', illustrates a cross section from the pixel thin film transistor Tpx to the common thin film transistor Tcom, and the sectional view of 6B, taken along the line II-II', illustrates a cross section of the second sensor thin film transistor Ts2. In the thin film transistor substrate, as shown in FIG. 5 and FIGS. 6A and 6B, the gate lines GL, the common lines CL, and the sensor gate lines SGLn−1 and SGLn are formed in parallel as a gate metal pattern on a lower substrate 34 together with gate electrodes 22, 42, 52, and 72 of the thin film transistors Tpx, Tcom, Ts1, and Ts2. The data lines DL, the sensor power lines PL, and the readout lines ROL, crossing the gate metal pattern, are formed in parallel as a data metal pattern on a gate dielectric layer 36 together with source electrodes 26, 46, 56, and 76 and drain electrodes 28, 48, 58, and 78 of the thin film transistors Tpx, Tcom, Ts1, and Ts2. The pixel electrodes 30 and the common electrodes 32 are formed as a transparent conductive layer on a passivation layer 38 together with contact electrodes 60 and 90. In order to form storage capacitors (not shown), the drain electrode 28 may be extended and be overlapped with the edge of the common electrode 32.

The pixel thin film transistor Tpx includes a gate electrode 22 protruded from the gate line GL, a semiconductor layer 24 overlapped with the gate electrode 22 under the condition that the gate dielectric layer 36 is interposed between the semiconductor layer 24 and the gate electrode 22, a source electrode 26 protruded from the data line DL and overlapped with the semiconductor layer 24, and a drain electrode 28 opposite to the source electrode 26 at a portion thereof overlapped with the semiconductor layer 24 and connected with the pixel electrode 30. The semiconductor layer 24 includes an active layer forming a channel between the source electrode 26 and the drain electrode 28, and an ohmic contact layer formed at a portion in which the active layer, the source electrode 26 and the drain electrode 28 are overlapped with each other so as to achieve an ohmic contact between the source electrode 26 and the drain electrode 28. The pixel electrode 30 is formed in the shape of plural fingers on the passivation layer 38, and is connected with the drain electrode 28 through a contact hole 29 penetrating the passivation layer 38.

The common thin film transistor Tcom includes a gate electrode 52 protruded from the gate line GL, a semiconductor layer 54 overlapped with the gate electrode 52 under the condition that the gate dielectric layer 36 is interposed between the semiconductor layer 54 and the gate electrode 52, a source electrode 56 connected with the common line CL and overlapped with the semiconductor layer 54, and a drain electrode 58 opposite to the source electrode 56 at a portion thereof overlapped with the semiconductor layer 54 and connected with the common electrode 32 through a contact hole 59 of the passivation layer 38. The common electrode 32 is formed in the shape of plural fingers alternating with the plural fingers of the pixel electrode 30 on the passivation layer 38 and is connected with the drain electrode 58 through the contact hole 59 penetrating the passivation layer 38. The semiconductor layer 54 and the source electrode 56 formed on the gate insulating layer 36 are overlapped with the gate line GL and the common line CL, and are connected with the common line CL through a contact hole 61 and a contact electrode 60. The contact hole 61 penetrates the passivation layer 38 and thus exposes one terminal of the source electrode 56, and penetrates the passivation layer 38 and the gate insulating layer 36 and thus exposes a part of the common line CL adjacent to the source electrode 56. The contact electrode 60 formed on the passivation layer 38 connects the source electrode 56 and the common line CL via the contact hole 61. The pixel electrode 30 is formed in the unit of each pixel, but the common electrode 32 is formed in the unit of plural pixels.

The first sensor thin film transistor Ts1 includes a gate electrode 42 protruded from the n−$1^{th}$ sensor gate line SGLn−1, a semiconductor layer 44 overlapped with the gate electrode 42 under the condition that the gate insulating layer 36 is interposed between the semiconductor layer 44 and the gate electrode 42, a source electrode 46 protruded from the sensor power line PL and overlapped with the semiconductor layer 44, and a drain electrode 48 opposite to the source electrode 46 at a portion thereof overlapped with the semiconductor layer 44 and connected with an extension part 32a of the common electrode 32 through a contact hole 49 penetrating the passivation layer 38. The extension part 32a of the common line 32 is extended from one terminal of the common electrode 32 of the adjacent pixel, traverses the data line DL and the sensor power line PL, and then is overlapped with one terminal of the drain electrode 48.

The second sensor thin film transistor Ts2 includes a gate electrode 72 connected with the $n^{th}$ sensor gate line SGLn, a semiconductor layer 74 overlapped with the gate electrode 72 under the condition that the gate insulating layer 36 is interposed between the semiconductor layer 74 and the gate electrode 72, a source electrode 76 protruded from the readout line ROL and overlapped with the semiconductor layer 74, and a drain electrode 78 opposite to the source electrode 76 at a portion thereof overlapped with the semiconductor layer 74 and connected with the common electrode 32 through a contact hole 79 penetrating the passivation layer 38. The gate electrode 76 is connected with the $n^{th}$ sensor gate line SGLn through contact holes 91 and 93 and the contact electrode 90. The contact electrode 90 formed on the passivation layer 38 is overlapped with the gate electrode 72, traverses the gate line GL and the common line CL, and then is overlapped with the $n^{th}$ sensor gate line SGLn. The contact electrode 90 is connected with one terminal of the gate electrode 72 through the contact hole 91 penetrating the passivation layer 38 and the gate insulating layer 36, and is connected with the $n^{th}$ sensor gate line SGLn through the contact hole 93 penetrating the passivation layer 38 and the gate insulating layer 36.

Hereinafter, a method for fabricating the thin film transistor substrate, as shown in FIG. 5 and FIGS. 6A and 6B, will be described.

A gate metal pattern, including the gate lines GL, the common lines CL, the sensor gate lines SGLn−1 and SGLn, the gate electrodes 22 of the pixel thin film transistors Tpx, the gate electrodes 52 of the common thin film transistors Tcom, and the gate electrodes 42 and 72 of the first and second sensor thin film transistors Ts1 and Ts2, is formed on the substrate 34.

The gate insulating layer 36 is formed on the substrate 34 provided with the gate metal pattern formed thereon. Then, a semiconductor pattern, including the semiconductor layer 24 of the pixel thin film transistors Tpx, the semiconductor layer 54 of the common thin film transistors Tcom, and the semiconductor layers 44 and 74 of the first and second sensor thin film transistors Ts1 and Ts2, is formed on the gate insulating layer 36.

A data metal pattern, including the data lines DL and the readout lines ROL, the sensor power lines PL, the source electrodes 26 and the drain electrodes 28 of the pixel thin film transistors Tpx, the source electrodes 56 and the drain electrodes 58 of the common thin film transistors Tcom, the source electrodes 46 and the drain electrodes 48 of the first sensor thin film transistors Ts1, and the source electrodes 76 and the drain electrodes 78 of the second sensor thin film transistors Ts2, is formed on the gate insulating layer 36 provided with the semiconductor pattern formed thereon.

The passivation layer 38 is formed on the gate insulating layer 36 provided with the data metal pattern formed thereon. Then, the contact holes 29, 49, 59, and 79 penetrating the passivation layer 38 and the contact holes 61, 91, and 93 penetrating the passivation layer 38 and the gate insulating layer 36 are formed. The contact hole 61 is formed by unifying a part penetrating the passivation layer 38 and a part penetrating the passivation layer 38 and the gate insulating layer 36.

A transparent conductive pattern, including the pixel electrodes 30, the common electrodes 32, and the contact electrodes 60 and 90, is formed on the passivation layer 38.

Figure 7:
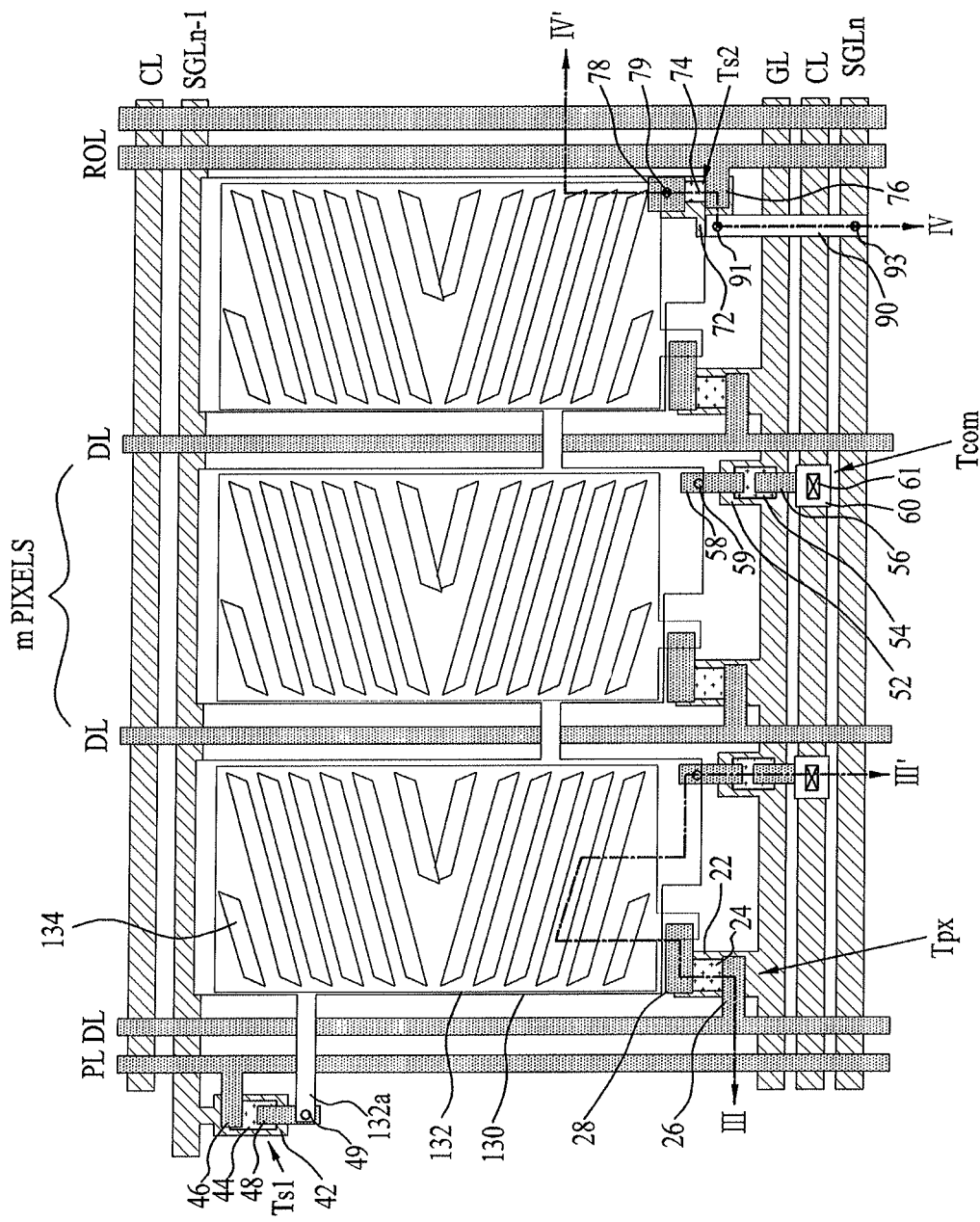
FIG. 7 is a plan view of a thin film transistor substrate for some pixels provided with one touch sensor in an FFS-mode liquid crystal display device having touch sensors embedded therein in accordance with another embodiment of the present invention.
Figure 8A:
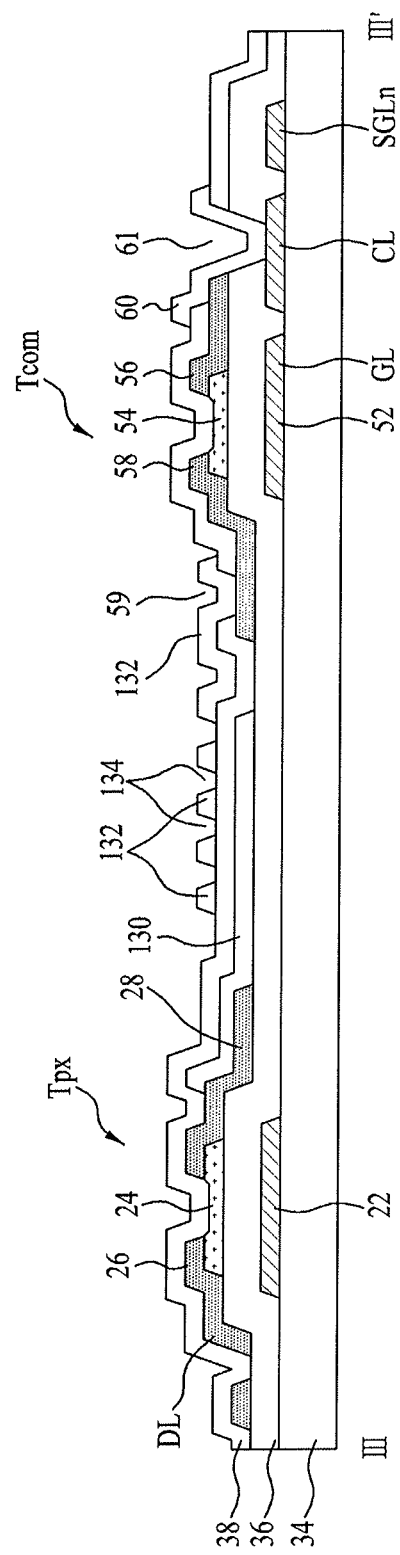
FIGS. 8A and 8B are sectional views of the thin film transistor substrate, taken along the line III-III' and the line IV-IV' of FIG. 7, respectively.
Figure 8B:
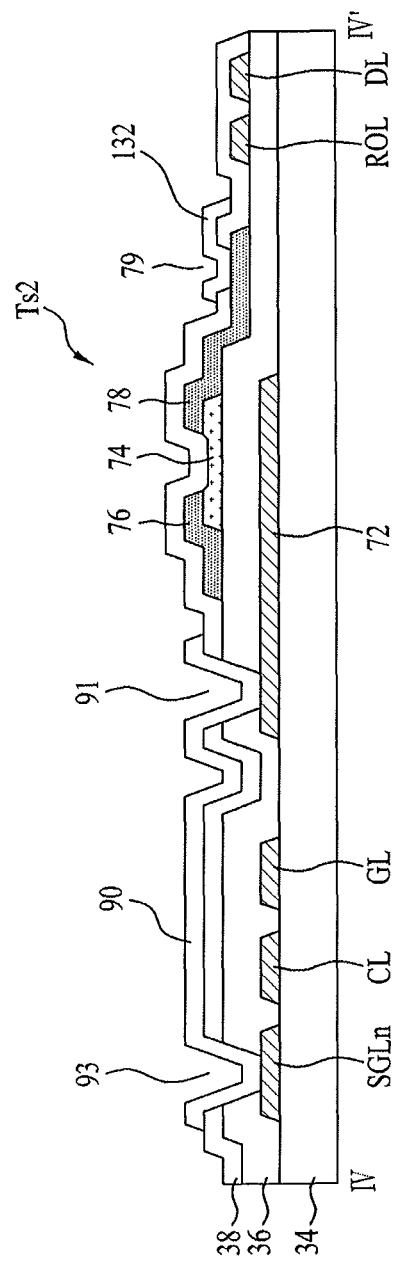

FIG. 7 is a plan view of a thin film transistor substrate for plural pixels provided with one touch sensor in an FFS-mode liquid crystal display device having touch sensors embedded therein in accordance with another embodiment of the present invention, and FIGS. 8A and 8B are sectional views of the thin film transistor substrate, taken along the line and the line IV-IV' of FIG. 7, respectively.

The FFS-mode thin film transistor substrate, as shown in FIG. 7 and FIGS. 8A and 8B, includes the same components as those of the IPS-mode thin film transistor substrate, as shown in FIG. 5 and FIGS. 6A and 6B, except for pixel electrodes 130 and common electrodes 132, and thus a detailed description of the same components will be omitted. The sectional view of 8A, taken along the line III-III', illustrates a cross section from a pixel thin film transistor Tpx to a common thin film transistor Tcom, and the sectional view of 8B, taken along the line IV-IV', illustrates a cross section of a second sensor thin film transistor Ts2.

In the thin film transistor substrate, as shown in FIG. 7 and FIGS. 8A and 8B, the gate lines GL, the common lines CL, and the sensor gate lines SGLn−1 and SGLn are formed in parallel as a gate metal pattern on a lower substrate 34 together with gate electrodes 22, 42, 52, and 72 of thin film transistors Tpx, Tcom, Ts1, and Ts2. The data lines DL, the sensor power lines PL, and the readout lines ROL, crossing the gate metal pattern, are formed in parallel as a data metal pattern on a gate insulating layer 36 together with source electrodes 26, 46, 56, and 76 and drain electrodes 28, 48, 58, and 78 of the thin film transistors Tpx, Tcom, Ts1, and Ts2. The pixel electrode 130 made of a transparent conductive layer is formed on the gate insulating layer 36, provided with the data metal pattern formed thereon, in the unit of each pixel, and the common electrode 132 made of the transparent conductive layer is formed on the passivation layer 38 in the unit of plural pixels together with contact electrodes 60 and 90. The pixel electrode 130 is formed in a plate shape on the drain electrode 28 of the pixel thin film transistor Tpx and the gate insulating layer 36 and is directly connected with the drain electrode 28. The common electrode 132 is overlapped with the pixel electrode 130 on the passivation layer 38 and is provided with a plurality of tilt slits 134, which are vertically symmetrical, thereby forming a horizontal electric field together with the pixel electrode 130 and thus driving liquid crystals. The common electrode 132 formed in one pixel formed is connected with a common electrode 132 of an adjacent pixel through an extension part 132a, thereby being formed in the unit of plural pixels. A storage capacitor Cst is formed by overlapping the pixel electrode 130 and the common electrode 132 with each other.

The drain electrode 58 of the common thin film transistor Tcom is connected with the common electrode 132 through a contact hole 59 of the passivation layer 38. The drain electrode 48 of the first sensor thin film transistor Ts1 is connected with the extension part 132a of the common electrode 132 through a contact hole 49 penetrating the passivation layer 38.

The drain electrode 78 of the second thin film transistor Ts2 is connected with the common electrode 132 through a contact hole 79 penetrating the passivation layer 38.

Hereinafter, a method for fabricating the thin film transistor substrate, as shown in FIG. 7 and FIGS. 8A and 8B, will be described.

A gate metal pattern, including the gate lines GL, the common lines CL, the sensor gate lines SGLn−1 and SGLn, the gate electrodes 22 of the pixel thin film transistors Tpx, the gate electrodes 52 of the common thin film transistors Tcom, and the gate electrodes 42 and 72 of the first and second sensor thin film transistors Ts1 and Ts2, is formed on the substrate 34.

The gate insulating layer 36 is formed on the substrate 34 provided with the gate metal pattern formed thereon. Then, a semiconductor pattern, including the semiconductor layer 24 of the pixel thin film transistors Tpx, the semiconductor layer 54 of the common thin film transistors Tcom, and the semiconductor layers 44 and 74 of the first and second sensor thin film transistors Ts1 and Ts2, is formed on the gate insulating layer 36.

A data metal pattern, including the data lines DL and the readout lines ROL, the sensor power lines PL, the source electrodes 26 and the drain electrodes 28 of the pixel thin film transistors Tpx, the source electrodes 56 and the drain electrodes 58 of the common thin film transistors Tcom, the source electrodes 46 and the drain electrodes 48 of the first sensor thin film transistors Ts1, and the source electrodes 76 and the drain electrodes 78 of the second sensor thin film transistors Ts2, is formed on the gate insulating layer 36 provided with the semiconductor pattern formed thereon.

Thereafter, the pixel electrodes 130 made of a transparent conductive layer are formed on the gate insulating layer 36 provided with the data metal pattern formed thereon.

The passivation layer 38 is formed on the gate insulating layer 36 provided with the pixel electrodes 130 formed thereon. Then, the contact holes 49, 59, and 79 penetrating the passivation layer 38 and the contact holes 61, 91, and 93 penetrating the passivation layer 38 and the gate insulating layer 36 are formed. The contact hole 61 is formed by unifying a part penetrating the passivation layer 38 and a part penetrating the passivation layer 38 and the gate insulating layer 36.

A transparent conductive pattern, including the common electrodes 32 and the contact electrodes 60 and 90, is formed on the passivation layer 38.

Figure 9:
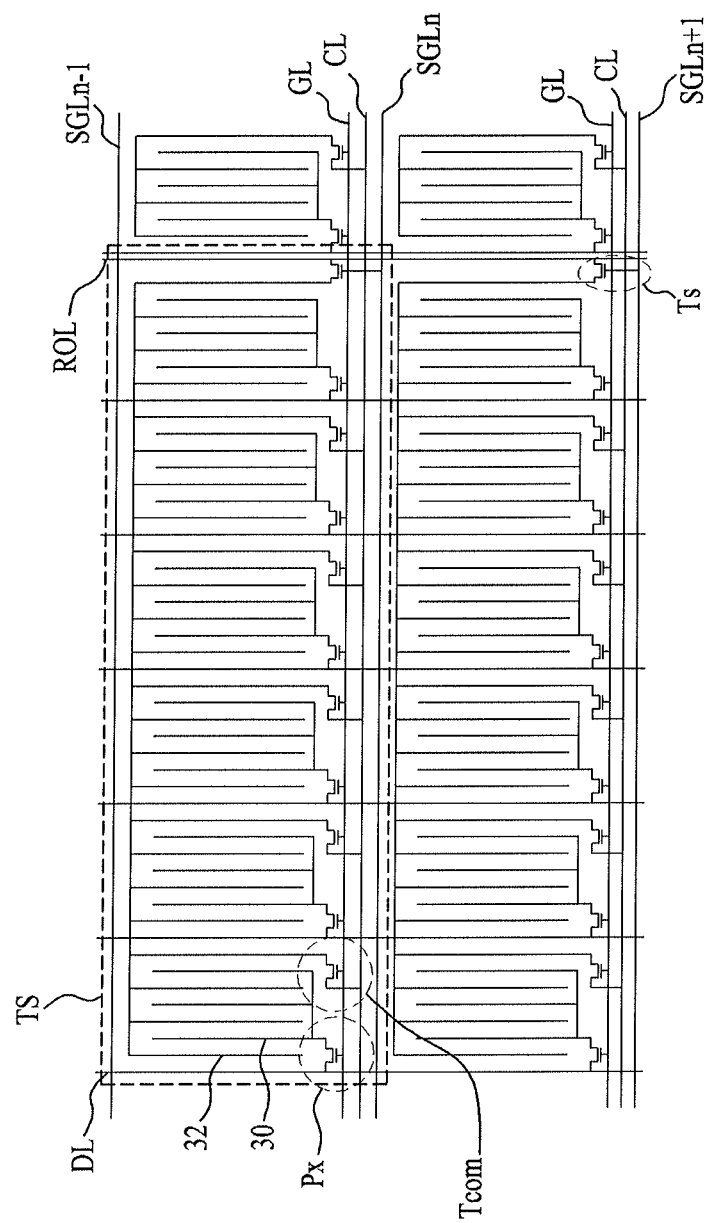
FIG. 9 is an equivalent circuit diagram of some pixels provided with one touch sensor in a liquid crystal display device having touch sensors embedded therein in accordance with another embodiment of the present invention.
Figure 10:
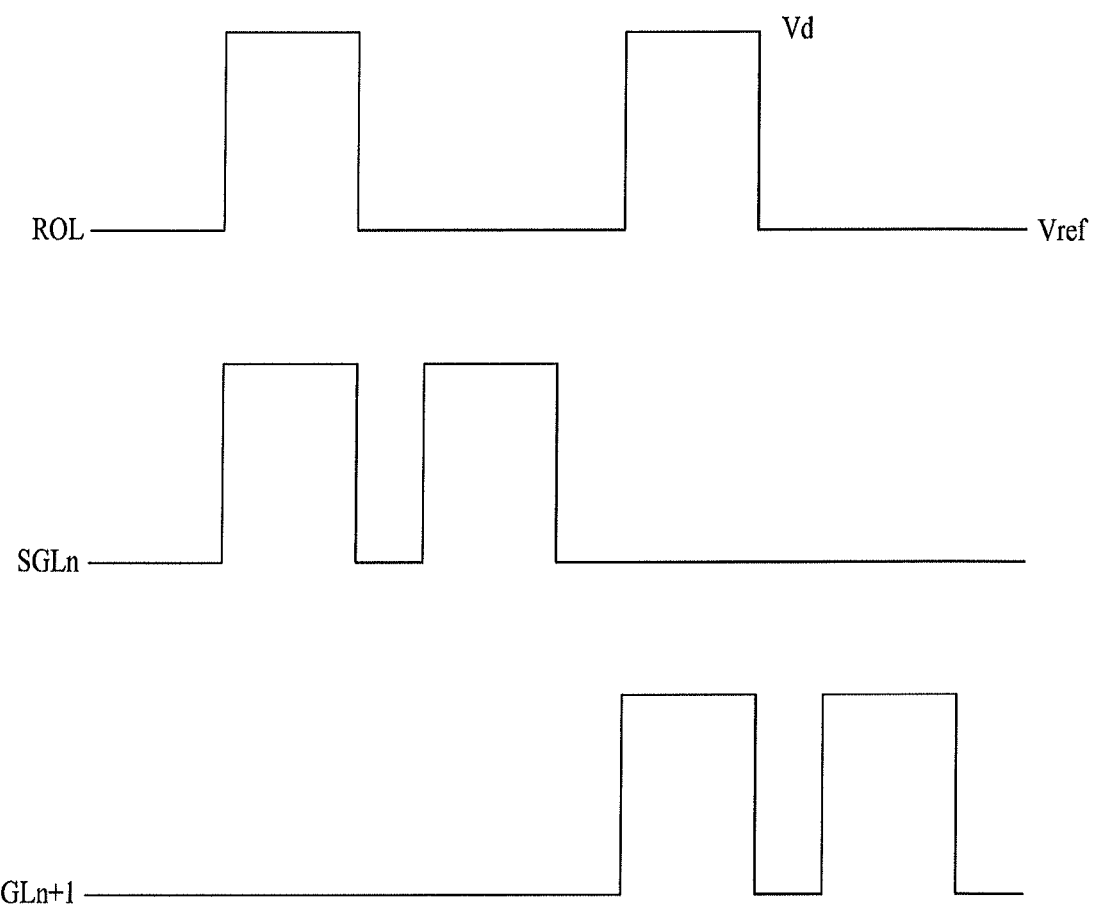
FIG. 10 is a view illustrating a driving wave form of the touch sensor of FIG. 9.

FIG. 9 is an equivalent circuit diagram of some pixels including one touch sensor in an IPS-mode liquid crystal display device having touch sensors embedded therein in accordance with another embodiment of the present invention, and FIG. 10 is a view illustrating a driving wave form of the touch sensor of FIG. 9.

The liquid crystal display device shown in FIG. 9 includes the same components as the liquid crystal display device shown in FIG. 3 except that the touch sensor of the liquid crystal display device, as shown in FIG. 9, includes one sensor thin film transistor Ts and does not require a separate sensor power line, and thus a detailed description of the same components will be omitted. Further, the liquid crystal display device, as shown in FIG. 9, includes the same components as those of the liquid crystal display devices, as shown in FIGS. 5 to 8B, except for the sensor power line and the first sensor thin film transistor.

The touch sensor formed in the unit of plural pixels includes sensor gate lines SGL formed in parallel with gate lines GI and a common line CL, a readout line ROL formed in parallel with plural data lines DL, a common electrode 32 formed in common in the plural pixels, and a sensor thin film transistor Ts connected between the sensor gate lines SGL, the readout line ROL, and the common electrode 32.

During touch sensing, the touch sensor TS formed in the unit of the plural pixels is driven by the sensor gate lines SGL, senses touch in a capacitive type, and outputs a sensing signal to the readout line ROL. The respective sensor gate lines SGL are sequentially driven divisionally during a charging time period in which the common electrode 32 is charged with sensing driving voltage Vd from the readout line RPL through the sensor thin film transistor Ts, and a reading period in which the common electrode 32 outputs the sensing signal to the readout line ROL through the thin film transistor Ts and the readout line ROL reads the sensing signal.

In detail, as shown in FIG. 10, during the charging period, a first gate pulse is supplied to the $n^{th}$ sensor gate line SGLn and the sensing driving voltage Vd is supplied to the readout line ROL. Thereby, the common electrode 32 is charged with the sensing driving voltage Vd from the readout line ROL through the turned-on sensor thin film transistor Ts.

Thereafter, during the reading time, a second gate pulse is supplied to the $n^{th}$ sensor gate line SGLn and reference voltage Vref, that is lower than the sensing driving voltage Vd, is supplied to the readout line ROL. Thereby, the common electrode 32 outputs the charging voltage as a sensing signal to the readout line ROL through the turned-on sensor thin film transistor Ts. Here, when a user touches the surface of the liquid crystal display device with a conductive object and thus the sensing capacitor Cf is generated, capacitance increases and thus the sensing signal output from the common electrode 32 to the readout line ROL increases, thereby representing the touch.

Thereafter, the first and second gate pulses are sequentially supplied to the $n+1^{th}$ sensor gate line SGLn+1 during the charging period and the reading period, thereby allowing the touch sensor TS connected with the $n+1^{th}$ sensor gate line SGLn+1 to sense touch.

The liquid crystal display device, as shown in FIG. 9, omits one sensor thin film transistor from each touch sensor TS and does not require a separate sensor power line, compared with the liquid crystal display device, as shown in FIG. 3, thereby having a simpler configuration and thus increasing aperture ratio.

Figure 11:
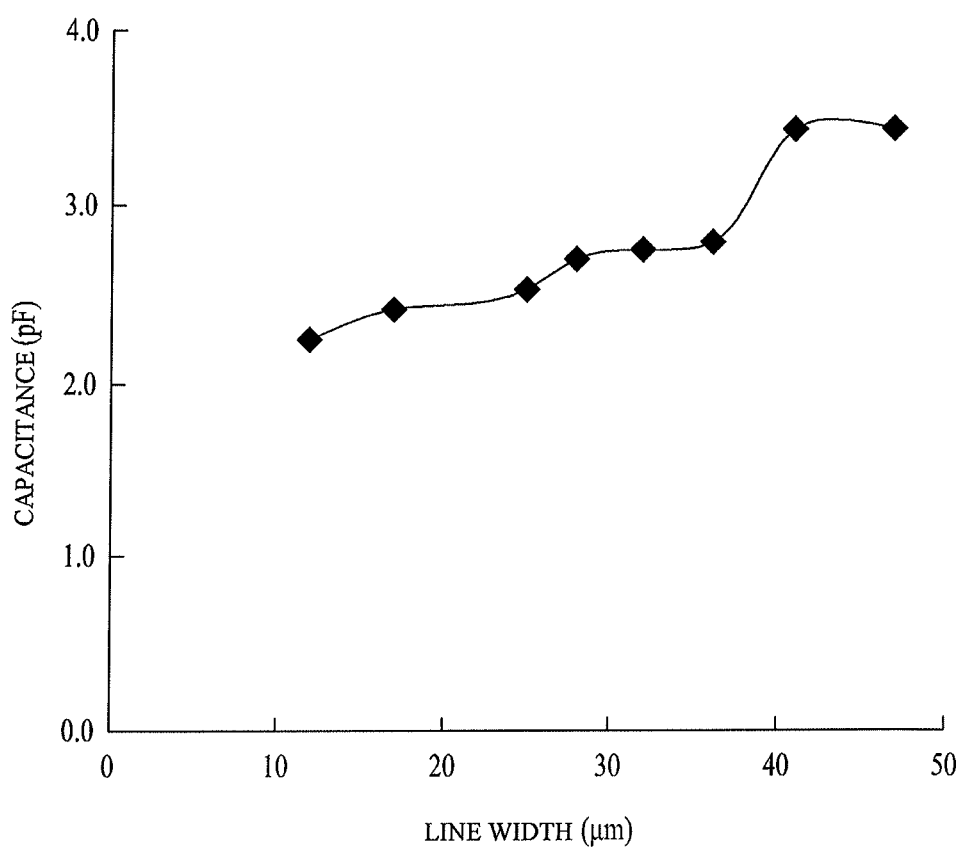
FIG. 11 is a graph illustrating magnitude data of capacitance when applicable touch of the liquid crystal display device in accordance with the present invention is generated.

FIG. 11 is a graph illustrating data obtained by measuring magnitudes of capacitance which are capable of being sensed by the touch sensor, when the liquid crystal display device in accordance with the present invention is touched.

During measurement of capacitance, a length of wiring is set to 5 cm and a line width of the wiring is changed in the range of 13~50 µm, a size of a counter electrode is set 5×5 mm, and a glass thickness is set to 0.5 mm. Here, since the capacitance is about 2 pF, as shown in FIG. 11, if the touch sensor is formed in the unit of plural pixels, as in the present invention, the capacitance may be sufficiently sensed as long as a difference (Vd−Vref) between sensing driving voltage and reference voltage is 1V or more.

As described above, the liquid crystal display device having touch sensors embedded therein in accordance with the present invention allows the touch sensors to be embedded in a thin film transistor substrate, thereby being capable of achieving weight and thickness reduction and reducing manufacturing costs.

Further, the liquid crystal display device in accordance with the present invention allows the touch sensors to be arranged in a matrix, thereby enabling multi-touch sensing.

Further, the liquid crystal display device in accordance with the present invention allows a common electrode to be patterned in the unit of plural pixels in a mode using horizontal electric fields, such as an IPS mode or an FFS mode, and thus uses the common electrode as an electrode of the touch sensor to sense touch in a capacitive type as well as a common electrode of liquid crystals, thereby simplifying the structure of the touch sensor and improving aperture ratio.

Further, the liquid crystal display device in accordance with the present invention forms the touch sensors using a manufacturing process of a thin film transistor substrate, thereby simplifying a manufacturing process of the liquid crystal display device and thus reducing the manufacturing costs.

Further, driving of the liquid crystal display device in accordance with the present invention is divided into a data recording period and a touch sensing period, thereby preventing image quality deterioration due to interference of the touch sensors.

Further, the liquid crystal display device in accordance with the present invention allows a sensing signal, output from the sensing electrode sensing touch to a readout line through a sensor thin film transistor, to be determined simply from the sum total of capacitances connected with the common electrode and a difference between sensing driving voltage and reference voltage, thereby being capable of outputting a precise sensing signal regardless of threshold voltage of the sensor thin film transistor.

It will be apparent to those skilled in the art that various modified embodiments and variations can be made in the present invention without departing from the spirit or scope of the inventions. Thus, it is intended that the present invention covers the modified embodiments and variations of this invention provided they come within the scope of the appended claims and their equivalents.

The invention claimed is:

1. A method for fabricating a liquid crystal display device having touch sensors embedded therein, comprising:
    forming a gate metal pattern, including gate electrodes of pixel thin film transistors, common thin film transistors, and sensor thin film transistors together with gate lines, common lines, and sensor gate lines, on a substrate;
    forming a gate insulating layer on the substrate provided with the gate metal pattern formed thereon;
    forming semiconductor layers of the pixel thin film transistors, the common thin film transistors, and the sensor thin film transistors on the gate insulating layer;
    forming a data metal pattern, including source electrodes and drain electrodes of the pixel thin film transistors, the common thin film transistors, and the sensor thin film transistors together with data lines and readout lines, on the gate insulating layer provided with the semiconductor layers formed thereon;
    forming a passivation layer covering the data metal pattern, and forming a plurality of contact holes; and
    forming pixel electrodes connected with the drain electrodes of the pixel thin film transistors, common electrodes connected with the drain electrodes of the common thin film transistors and the sensor thin film transistors, first contact electrodes to connect the source electrodes of the common thin film transistors and the common lines, and second contact electrodes to connect the gate electrodes of the sensor thin film transistors and the sensor gate lines, on the passivation layer, the connection of the electrodes being achieved through the plurality of contact holes.

2. The method according to claim 1, further comprising:
    forming sensor power lines together with the data lines; and forming second sensor thin film transistors, each of which is connected between the previous sensor gate line, each sensor power line, and each common line, together with the pixel thin film transistors, the common thin film transistors, and the sensor thin film transistors.

3. The method according to claim 1, wherein the pixel electrodes are independently formed in the unit of each pixel, and the common electrodes are independently formed in the unit of each touch sensor including plural pixels.

4. A method for fabricating a liquid crystal display device having touch sensors embedded therein, comprising:

forming a gate metal pattern, including gate electrodes of pixel thin film transistors, common thin film transistors, and sensor thin film transistors together with gate lines, common lines, and sensor gate lines, on a substrate;

forming a gate insulating layer on the substrate provided with the gate metal pattern formed thereon;

forming semiconductor layers of the pixel thin film transistors, the common thin film transistors, and the sensor thin film transistors on the gate insulating layer;

forming a data metal pattern, including source electrodes and drain electrodes of the pixel thin film transistors, the common thin film transistors, and the sensor thin film transistors together with data lines and readout lines, on the gate insulating layer provided with the semiconductor layers formed thereon;

forming pixel electrodes connected with the drain electrodes of the pixel thin film transistors on the gate insulating layer provided with the data metal pattern formed thereon;

forming a passivation layer covering the pixel electrodes, and forming a plurality of contact holes; and forming common electrodes connected with the drain electrodes of the common thin film transistors and the sensor thin film transistors, first contact electrodes to connect the source electrodes of the common thin film transistors and the common lines, and second contact electrodes to connect the gate electrodes of the sensor thin film transistors and the sensor gate lines, on the passivation layer, the connection of the common electrodes, the first contact electrodes, and the second contact electrodes being achieved through the plurality of contact holes.

5. The method according to claim 4, further comprising:
forming sensor power lines together with the data lines; and forming second sensor thin film transistors, each of which is connected between the previous sensor gate line, each sensor power line, and each common line, together with the pixel thin film transistors, the common thin film transistors, and the sensor thin film transistors.

6. The method according to claim 4, wherein the pixel electrodes are independently formed in the unit of each pixel, and the common electrodes are independently formed in the unit of each touch sensor including plural pixels.

* * * * *